United States Patent
Hyobu

(10) Patent No.: US 7,843,206 B2
(45) Date of Patent: Nov. 30, 2010

(54) SEMICONDUCTOR INTEGRATED CIRCUIT AND METHOD FOR INSPECTING SAME

(75) Inventor: Kazuyuki Hyobu, Kyoto (JP)

(73) Assignee: Panasonic Corporation, Osaka (JP)

( * ) Notice: Subject to any disclaimer, the term of this patent is extended or adjusted under 35 U.S.C. 154(b) by 11 days.

(21) Appl. No.: 12/279,767

(22) PCT Filed: Aug. 3, 2006

(86) PCT No.: PCT/JP2006/315385

§ 371 (c)(1),
(2), (4) Date: Aug. 18, 2008

(87) PCT Pub. No.: WO2007/097053

PCT Pub. Date: Aug. 30, 2007

(65) Prior Publication Data

US 2009/0224794 A1    Sep. 10, 2009

(30) Foreign Application Priority Data

Feb. 23, 2006  (JP) .............................. 2006-047238

(51) Int. Cl.
*G01R 31/02* (2006.01)
*G01R 31/26* (2006.01)

(52) U.S. Cl. ..................... 324/763; 324/765; 324/769; 257/48; 716/4

(58) Field of Classification Search ......... 324/754–765, 324/769, 158.1; 257/48; 438/14–18
See application file for complete search history.

(56) References Cited

U.S. PATENT DOCUMENTS

| 6,762,486 B2 | 7/2004 | Inoue et al. |
| 2004/0027150 A1* | 2/2004 | Miura et al. ................. 324/765 |
| 2005/0162182 A1* | 7/2005 | Ong ........................... 324/765 |
| 2005/0230796 A1 | 10/2005 | Sakamoto et al. |
| 2009/0102503 A1* | 4/2009 | Saito .......................... 324/765 |

FOREIGN PATENT DOCUMENTS

| JP | 10-082834 | 3/1998 |
| JP | 2002-131400 | 5/2002 |
| JP | 2006-226908 | 8/2006 |

* cited by examiner

*Primary Examiner*—Ha Tran T Nguyen
*Assistant Examiner*—Emily Y Chan
(74) *Attorney, Agent, or Firm*—McDermott Will & Emery LLP

(57) ABSTRACT

An internal connection output pad (14A) connected to a CMOS output circuit (15A, 16A) on a first chip (11A) is electrically connected via a chip-to-chip bonding wire (17) to an internal connection input pad (14B) connected to a CMOS input circuit (15B, 16B) on a second chip (11B). In order to inspect the presence or absence of leakage resistance (40), a test circuit (30) controls a high-impedance output state, a high-level output state and a low-level output state of the internal connection output pad (14A) via the CMOS output circuit (15A, 16A). If a difference between a value obtained by measuring a current flowing through a power supply to a ground in the high-impedance output state and a value obtained by measuring such a current in the high-level output state is calculated, a transistor leakage current is canceled, so that a correct minute leakage current can be detected.

6 Claims, 8 Drawing Sheets

| TE | OUT | C1 | C2 | OUTP | OUTN | PAD |
|---|---|---|---|---|---|---|
| L | L | L | L | L | L | H |
| L | L | L | H | L | L | H |
| L | L | H | L | L | L | H |
| L | L | H | H | L | L | H |
| L | H | L | L | H | H | L |
| L | H | L | H | H | H | L |
| L | H | H | L | H | H | L |
| L | H | H | H | H | H | L |
| H | L | L | L | L | L | H |
| H | L | L | H | H | H | L |
| H | L | H | L | H | L | Hi-Z |
| H | L | H | H | H | L | Hi-Z |
| H | H | L | L | L | L | H |
| H | H | L | H | H | H | L |
| H | H | H | L | H | L | Hi-Z |
| H | H | H | H | H | L | Hi-Z |

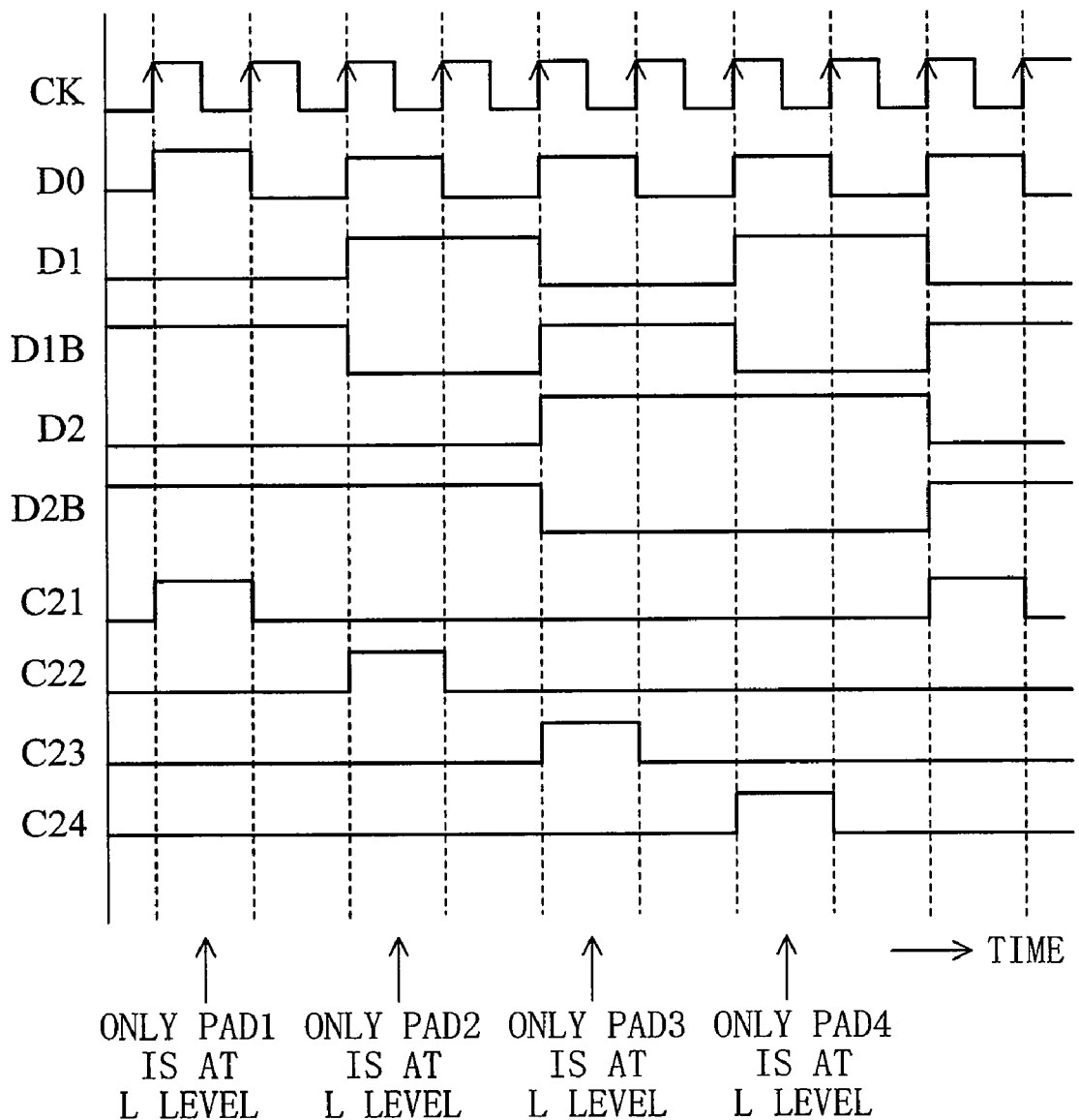

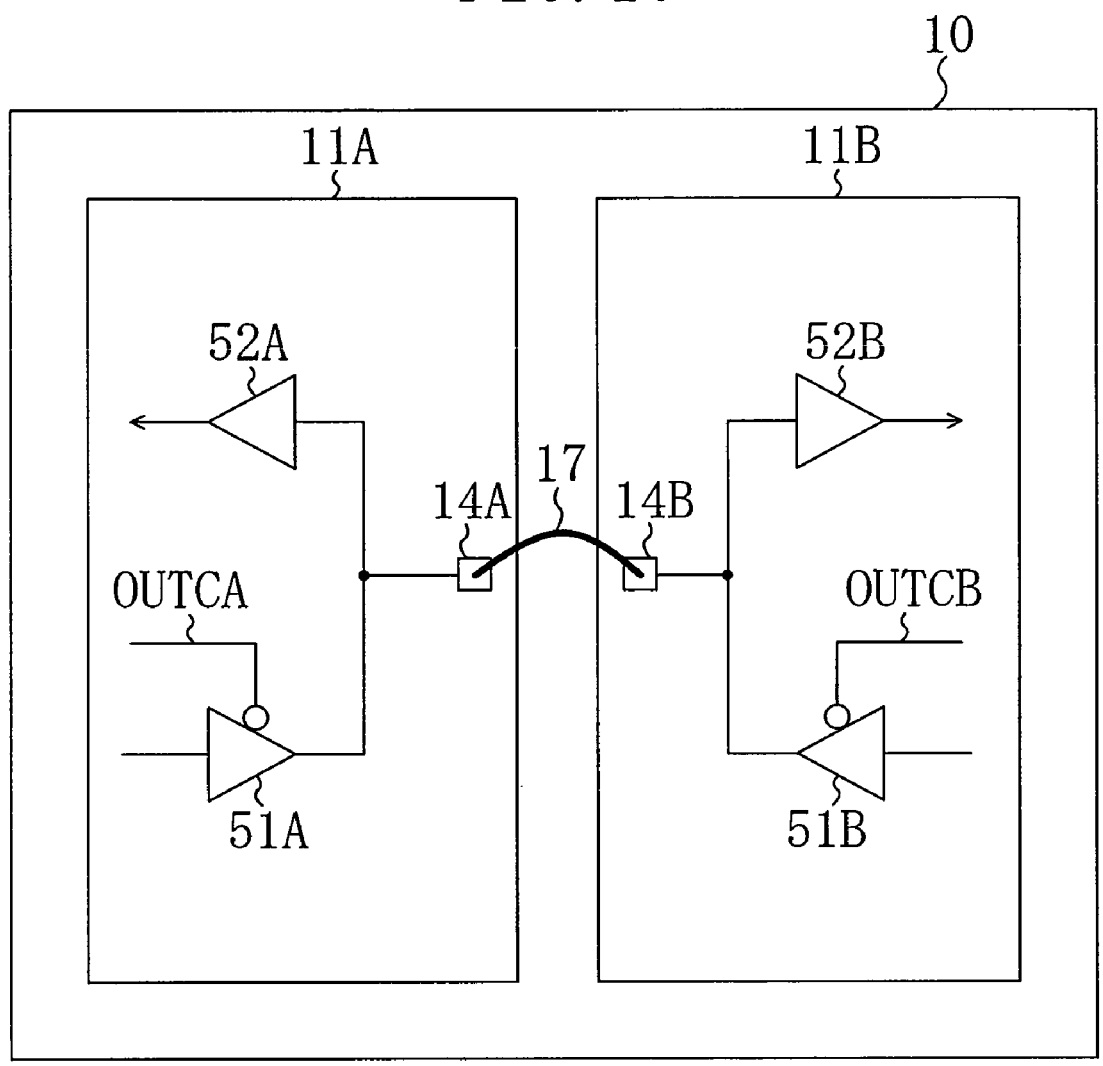

SEMICONDUCTOR INTEGRATED CIRCUIT AND METHOD FOR INSPECTING SAME

RELATED APPLICATIONS

This application is the U.S. National Phase under 35 U.S.C. §371 of International Application No. PCT/JP2006/315385, filed on Aug. 3, 2006, which in turn claims the benefit of Japanese Application No. 2006-047238, filed on Feb. 23, 2006, the disclosures of which Applications are incorporated by reference herein.

TECHNICAL FIELD

The present invention relates to a technique of performing leakage current measurement at a chip-to-chip internal connection pad that is not externally exposed after sealing, with high precision, in a semiconductor integrated circuit including a plurality of chips that are enclosed in the same package.

BACKGROUND ART

In recent years, semiconductor integrated circuits called MCP (multichip in package) or MCM (multichip in module) in which a plurality of chips are enclosed in the same package have been manufactured. A bonding pad provided on each chip is connected to an external terminal via a bonding wire, and also, wire bonding is performed between each chip.

If wire bonding is performed with respect to a chip that is charged with static electricity, electric charges may be released, so that a circuit in the vicinity of a pad may be damaged. When the circuit is significantly damaged, the circuit no longer logically operates, so that the circuit can be detected as a defective product by a typical function test. However, when the damage on the circuit is not significant, the circuit still logically normally operates, so that it is difficult to detect the circuit as a defective product by the function test. In addition, as is different from a bonding pad connected to an external terminal, it is difficult to detect circuit damage occurring in the vicinity of a bonding pad for chip-to-chip internal connection.

There is a certain conventional technique of examining whether or not circuit damage has occurred during wire bonding of a chip-to-chip internal connection pad. In this technique, after an input pad on a first chip is disconnected from an internal circuit of the first chip, an output pad on a second chip is set to be in a high (H) level output state or a low (L) level output state. By measuring a quiescent power supply current (IDDS) in this state, the occurrence of a minute leakage current in these internal connection pads is detected (see Patent Document 1).

Patent Document 1: Japanese Unexamined Patent Application Publication No. 2002-131400

DISCLOSURE OF THE INVENTION

Problems to be Solved by the Invention

In recent years, as the miniaturization of manufacturing processes for semiconductor integrated circuits has been advanced, the threshold voltage of a transistor needs to be decreased, so that IDDS tends to increase. When IDDS increases, a minute leakage current due to circuit damage in the vicinity of a pad is likely to be smaller than IDDS. In this case, a defective product cannot be correctly detected by measurement of IDDS.

Also, IDDS may be used to detect a leakage current at an internal connection pad. In this case, a test circuit needs to be provided in each of all chips enclosed in the same package. Therefore, for example, the number of parts mounted on a circuit board may be reduced by enclosing a conventional chip and a newly developed chip in the same package. In this case, a test circuit needs to be incorporated into the conventional chip, i.e., a change needs to be made in the conventional chip.

An object of the present invention is to provide a semiconductor integrated circuit in which a leakage current caused by chip-to-chip wire bonding can be easily and correctly detected without leading to an increase in the number of test circuits, and a method for inspecting the semiconductor integrated circuit.

Solution to the Problems

To achieve the object, the present invention provides a semiconductor integrated circuit comprising a first chip and a second chip. The second chip has an internal connection input pad, and a CMOS input circuit connected to the internal connection input pad. The first chip has an internal connection output pad electrically connected via a bonding wire to the internal connection input pad, a CMOS output circuit connected to the internal connection output pad, and a test circuit for controlling, via the CMOS output circuit, a high-impedance (Hi-Z) output state, a high (H) level output state and a low (L) level output state of the internal connection output pad.

The semiconductor integrated circuit is inspected as follow. A first current flowing through a path from a power supply to a ground is measured while the internal connection output pad is controlled to be in a high-impedance output state. A second current flowing through a path from a power supply to a ground is measured while the internal connection output pad is controlled to be in a high-level output state. A third current flowing through a path from a power supply to a ground while the internal connection output pad is controlled to be in a low-level output state. When leakage caused by chip-to-chip wire bonding occurs on the ground side, the second current contains a minute leakage current. When such leakage occurs on the power supply side, the third current contains a minute leakage current. Also, the first, second and third currents each contain a transistor leakage current. Therefore, if a difference between the first current and the second current is calculated and a difference between the first current and the third current is calculated, the transistor leakage current is canceled, so that a correct minute leakage current is detected. The presence or absence of a defect is determined based on a magnitude of the minute leakage current.

Effect of the Invention

According to the present invention, only a minute leakage current caused by chip-to-chip wire bonding can be correctly detected based on the result of current measurement in each output state (Hi-Z, H-level, L-level) of an output pad, so that a deterioration in inspection precision caused by an increase in IDDS due to a decrease in threshold voltage of a transistor can be prevented. In addition, the state of an output pad is controlled via a CMOS output circuit on a first chip, so that the configuration of a test circuit can be simplified.

BRIEF DESCRIPTION OF THE DRAWINGS

FIG. 9 is a timing chart showing an operation of the test circuit having the configurations of FIGS. 6 to 8.

FIG. 10 is a circuit diagram showing still another exemplary configuration of the semiconductor integrated circuit of the present invention.

Figure 1:
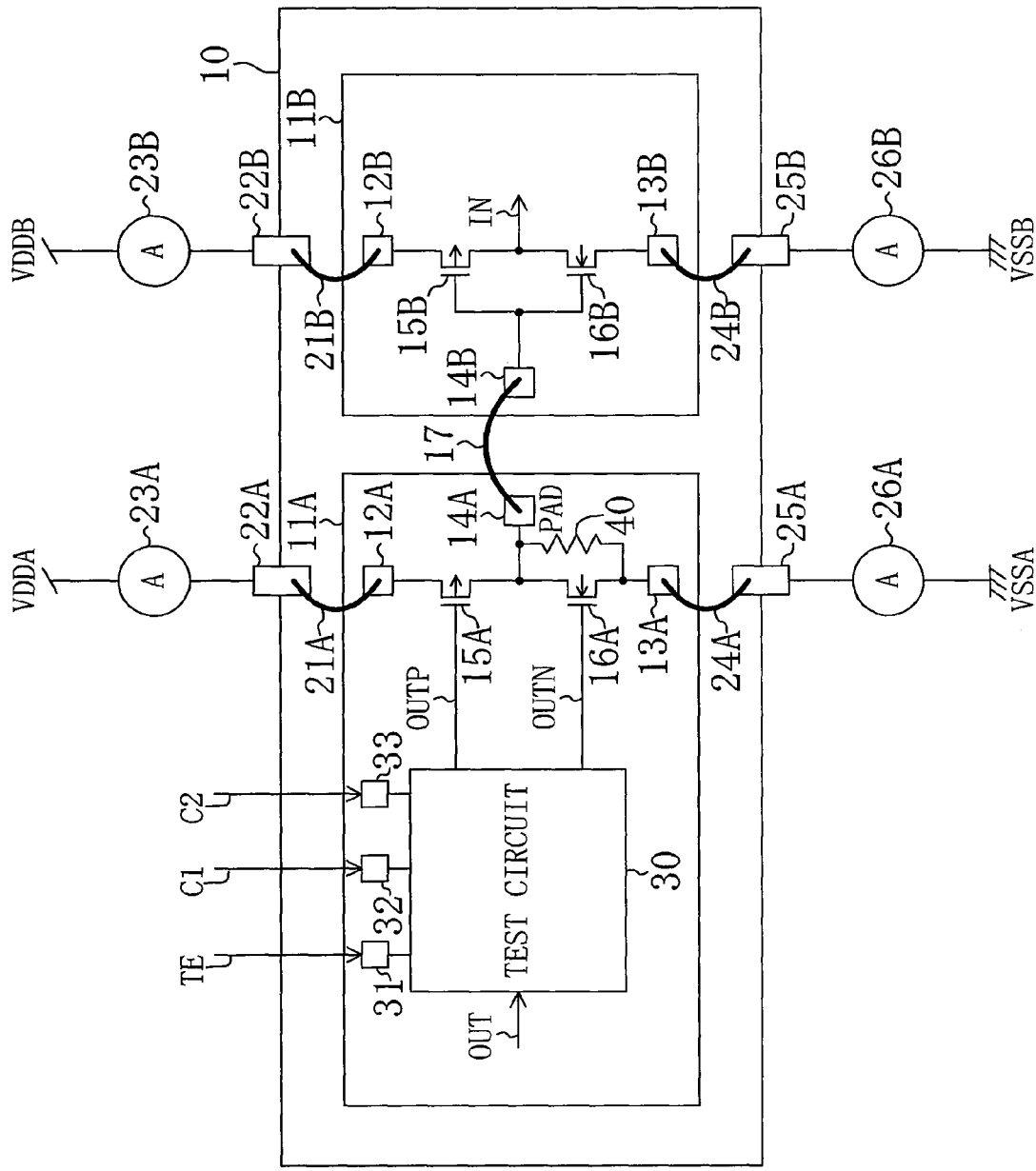
FIG. 1 is a circuit diagram showing an exemplary configuration of a semiconductor integrated circuit according to the present invention.

DESCRIPTION OF THE REFERENCE CHARACTERS 10 semiconductor integrated circuit
11A first chip
11B second chip
12A, 12B power supply pad
13A, 13B ground pad
14A, 14B internal connection pad
14A1 to 14An internal connection pad (output pad)
14B1 to 14Bn internal connection pad (input pad)
15A, 15B P-channel MOS transistor
16A, 16B N-channel MOS transistor
17 chip-to-chip bonding wire
171 to 17n chip-to-chip bonding wire
21A, 21B bonding wire
22, 22A, 22B external terminal (power supply terminal)
23A, 23B ammeter
24A, 24B bonding wire
25, 25A, 25B external terminal (ground terminal)
26A, 26B ammeter
30 test circuit
31, 32, 33 test pad
40, 41, 42 leakage resistance
51A, 51B tri-state buffer
52A, 52B input buffer
200 frequency-division circuit
250 output level control signal generating circuit
300 pad output control signal generating circuit
C1 output impedance control signal
C2 output level control signal
C21 to C24 output level control signal
CK clock signal
IN internal input signal
OUT internal output signal
OUTCA, OUTCB buffer output control signal
OUTP, OUTN pad output control signal
OUTP1 to OUTP4 pad output control signal
OUTN1 to OUTN4 pad output control signal
PAD pad output
PAD1 to PADn pad output
TE test enable signal
VDDA, VDDB power supply
VSSA, VSSB ground

BEST MODE FOR CARRYING OUTPUT THE INVENTION

Hereinafter, embodiments of the present invention will be described with reference to the accompanying drawings.

FIG. 1 shows an exemplary configuration of a semiconductor integrated circuit according to the present invention. The semiconductor integrated circuit 10 of FIG. 1 includes a first chip 11A and a second chip 11B.

The first chip 11A has a power supply pad 12A, a ground pad 13A, an output pad 14A for internal connection, a P-channel MOS transistor 15A, and an N-channel MOS transistor 16A. The source and drain of the P-channel MOS transistor 15A are connected to the power supply pad 12A and the internal connection output pad 14A, respectively. The source and drain of the N-channel MOS transistor 16A are connected to the ground pad 13A and the internal connection output pad 14A, respectively.

The second chip 11B has a power supply pad 12B, a ground pad 13B, an input pad 14B for internal connection, a P-channel MOS transistor 15B, and an N-channel MOS transistor 16B. The gate and source of the P-channel MOS transistor 15B are connected to the internal connection input pad 14B and the power supply pad 12B, respectively. The gate and source of the N-channel MOS transistor 16B are connected to the internal connection input pad 14B and the ground pad 13B, respectively.

The internal connection output pad 14A on the first chip 11A is electrically connected via a chip-to-chip bonding wire 17 to the internal connection input pad 14B on the second chip 11B. The P-channel MOS transistor 15A and the N-channel MOS transistor 16A on the first chip 11A constitute a CMOS output circuit that is connected to the internal connection input pad 14B. The P-channel MOS transistor 15B and the N-channel MOS transistor 16B on the second chip 11B constitute a CMOS input circuit that is connected to the internal connection input pad 14B, and the drains of these transistors are connected together so that an internal input signal IN is supplied to an internal circuit (not shown) of the second chip 11B.

The first chip 11A further has a test circuit 30 for controlling a Hi-Z output state, an H-level output state and an L-level output state of the internal connection output pad 14A via the CMOS output circuit (15A, 16A), and test pads 31, 32 and 33. The test circuit 30 receives an internal output signal OUT from an internal circuit (not shown) of the first chip 11A and receives a test enable signal TE, an output impedance control signal C1, and an output level control signal C2 from the outside via the test pads 31, 32 and 33, respectively, and supplies pad output control signals OUTP and OUTN to the gates of the P-channel MOS transistor 15A and the N-channel MOS transistor 16A, respectively.

The semiconductor integrated circuit 10 of FIG. 1 further has first, second, third and fourth external terminals 22A, 22B, 25A and 25B. The first external terminal 22A, which is a power supply terminal of the first chip 11A, is connected via a bonding wire 21A to the power supply pad 12A on the first chip 11A. The second external terminal 22B, which is a power supply terminal of the second chip 11B, is connected to a bonding wire 21B to the power supply pad 12B on the second chip 11B. The third external terminal 25A, which is a ground terminal of the first chip 11A, is connected via a bonding wire 24A to the ground pad 13A on the first chip 11A. The fourth external terminal 25B, which is a ground terminal of the second chip 11B, is connected via a bonding wire 24B to the ground pad 13B on the second chip 11B.

When the semiconductor integrated circuit 10 of FIG. 1 is inspected, the first external terminal 22A is connected via a first ammeter 23A to a power supply VDDA, the second external terminal 22B is connected via a second ammeter 23B to a power supply VDDB, and the third external terminal 25A is connected via a third ammeter 26A to a ground VSSA, and the fourth external terminal 25B is connected via a fourth ammeter 26B to a ground VSSB. TE, C1 and C2 are supplied to the test pads 31, 32 and 33 by contacting probe needles to these pads. Note that, as long as a constraint on the number of external terminals is satisfied, the test pads 31, 32 and 33 may be connected via bonding wires to the respective external terminals so as to enable inspection after sealing the package.

In FIG. 1, it is assumed that when wire bonding is performed between both the chips 11A and 11B, leakage resistance 40 occurs between the internal connection output pad 14A and the ground pad 13A on the first chip 11A. In FIG. 1, "PAD" represents a pad output (voltage) of the internal connection output pad 14A.

Figures 2, 3:
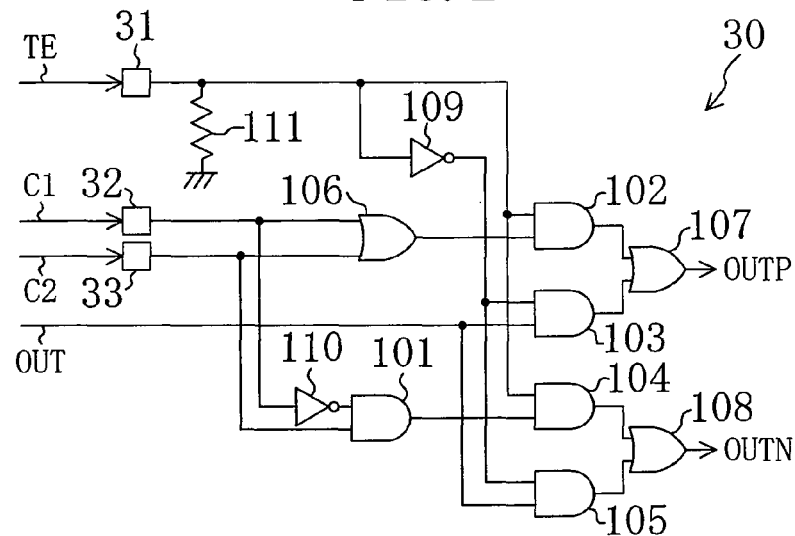
FIG. 2 is a circuit diagram showing a detailed exemplary configuration of a test circuit of FIG. 1.
FIG. 3 is a diagram showing an operation of the test circuit of FIG. 2.

FIG. 2 shows a detailed exemplary configuration of the test circuit 30 of FIG. 1. The test circuit 30 of FIG. 2 includes five AND gates 101, 102, 103, 104 and 105, three OR gates 106, 107 and 108, and two inverters 109 and 110. The signal line TE is connected via a pull-down resistor 111 to the ground.

FIG. 3 shows an operation of the test circuit 30 of FIG. 2. During a normal operation of the semiconductor integrated circuit 10 of FIG. 1, TE is set to be "L" by the pull-down resistor 111 (TE="L"). In this case, a level of the pad output PAD is controlled to be "H" or "L" only by OUT irrespective of C1 and C2. In other words, the P-channel MOS transistor 15A and the N-channel MOS transistor 16A on the first chip 11A operate as a CMOS inverter. During inspection of the semiconductor integrated circuit 10 of FIG. 1, TE is set to be "H" (TE="H"). If TE="H" and C1="H", the pad output PAD is in the Hi-Z state irrespective of C2 and OUT. Also, if TE="H" and C1="L", the level of the pad output PAD is controlled to be "H" or "L" only by C2 irrespective of OUT.

Referring back to FIG. 1, a method for inspecting the presence or absence of the leakage resistance 40 will be described. Initially, while the internal connection output pad 14A is controlled to be in the Hi-Z output state by the test circuit 30, first current measurement is performed using the first to fourth ammeters 23A, 23B, 26A and 26B. In this case, since OUTP="H" and OUTN="L", the P-channel MOS transistor 15A and the N-channel MOS transistor 16A on the first chip 11A are both in the OFF state. Either the P-channel MOS transistor 15B or the N-channel MOS transistor 16B on the second chip 11B is in the OFF state at any time irrespective of the presence or absence of the leakage resistance 40. Even if the leakage resistance 40 is present, a current does not flow through the leakage resistance 40. Therefore, only a transistor leakage current can be measured by any of the first to fourth ammeters 23A, 23B, 26A and 26B.

Next, while the internal connection output pad 14A is controlled to be in the H-level output state by the test circuit 30, second current measurement is performed using the first to fourth ammeters 23A, 23B, 26A and 26B. In this case, since OUTP="L" and OUTN="L", the P-channel MOS transistor 15A is in the ON state and the N-channel MOS transistor 16A is in the OFF state on the first chip 11A. Either the P-channel MOS transistor 15B or the N-channel MOS transistor 16B is in the OFF state at any time on the second chip 11B. Therefore, when the leakage resistance 40 illustrated is not present, only a transistor leakage current can be measured by any of the first to fourth ammeters 23A, 23B, 26A and 26B. When the leakage resistance 40 is present between the internal connection output pad 14A and the ground pad 13A on the first chip 11A as illustrated, a minute leakage current flows through the leakage resistance 40, so that a superimposition of a transistor leakage current and the minute leakage current is measured by the first ammeter 23A and the third ammeter 26A. Here, if a difference between the result of the first current measurement and the result of the second current measurement in the first ammeter 23A or the third ammeter 26A is calculated, the transistor leakage current is canceled to detect a correct minute leakage current, so that the presence of the leakage resistance 40 is found.

Similarly, when leakage resistance is present between the internal connection input pad 14B and the ground pad 13B on the second chip 11B, then if a difference between the result of the first current measurement and the result of the second current measurement in the first ammeter 23A or the fourth ammeter 26B is calculated, a transistor leakage current is canceled to detect a correct minute leakage current, so that the presence of the leakage resistance is found.

When leakage resistance is present between the internal connection output pad 14A and the power supply pad 12A on the first chip 11A, third current measurement is performed using the first to fourth ammeters 23A, 23B, 26A and 26B while the internal connection output pad 14A is controlled to be in the L-level output state by the test circuit 30. If a difference between the result of the first current measurement and the result of the third current measurement in the first ammeter 23A or the third ammeter 26A is calculated, a transistor leakage current is canceled to detect a correct minute leakage current, so that the presence of the leakage resistance is found. Similarly, when leakage resistance is present between the internal connection input pad 14B and the power supply pad 12B on the second chip 11B, then if a difference between the result of the first current measurement and the result of the third current measurement in the second ammeter 23B or the third ammeter 26A is calculated, a transistor leakage current is canceled to detect a correct minute leakage current, so that the presence of the leakage resistance is found.

As described above, in the semiconductor integrated circuit 10 of FIG. 1, only a minute leakage current caused by chip-to-chip wire bonding can be correctly detected based on the result of the current measurement in each output state (Hi-Z, H-level, L-level) of the internal connection output pad 14A, so that a deterioration in inspection precision caused by an increase in IDDS due to a decrease in threshold voltage of a transistor can be prevented.

Note that when the first and second external terminals 22A and 22B are integrated into a single external terminal, an ammeter may be connected to the single external terminal and a current flowing in from a single power supply may be measured using the ammeter. Also, when the third and fourth external terminals 25A and 25B are integrated into a single external terminal, an ammeter may be connected to the single external terminal and a current flowing out to a single ground may be measured using the ammeter.

When the first chip 11A has a plurality of internal connection output pads and the second chip 11B has a plurality of internal connection input pads, and the first chip 11A and the second chip 11B are electrically connected via a plurality of bonding wires, then if the pad output control signals OUTP and OUTN output from the test circuit 30 are distributed to CMOS output circuits connected to the internal connection output pads, the high-impedance output states, high-level output states and low-level output states of the internal connection output pads can be controlled via the CMOS output circuits, so that only a minute leakage current caused by chip-to-chip wire bonding can be correctly detected as is similar to that described above. Note that since all pad outputs have the same phase, a leakage current between bonding wires cannot be detected.

Figure 4:
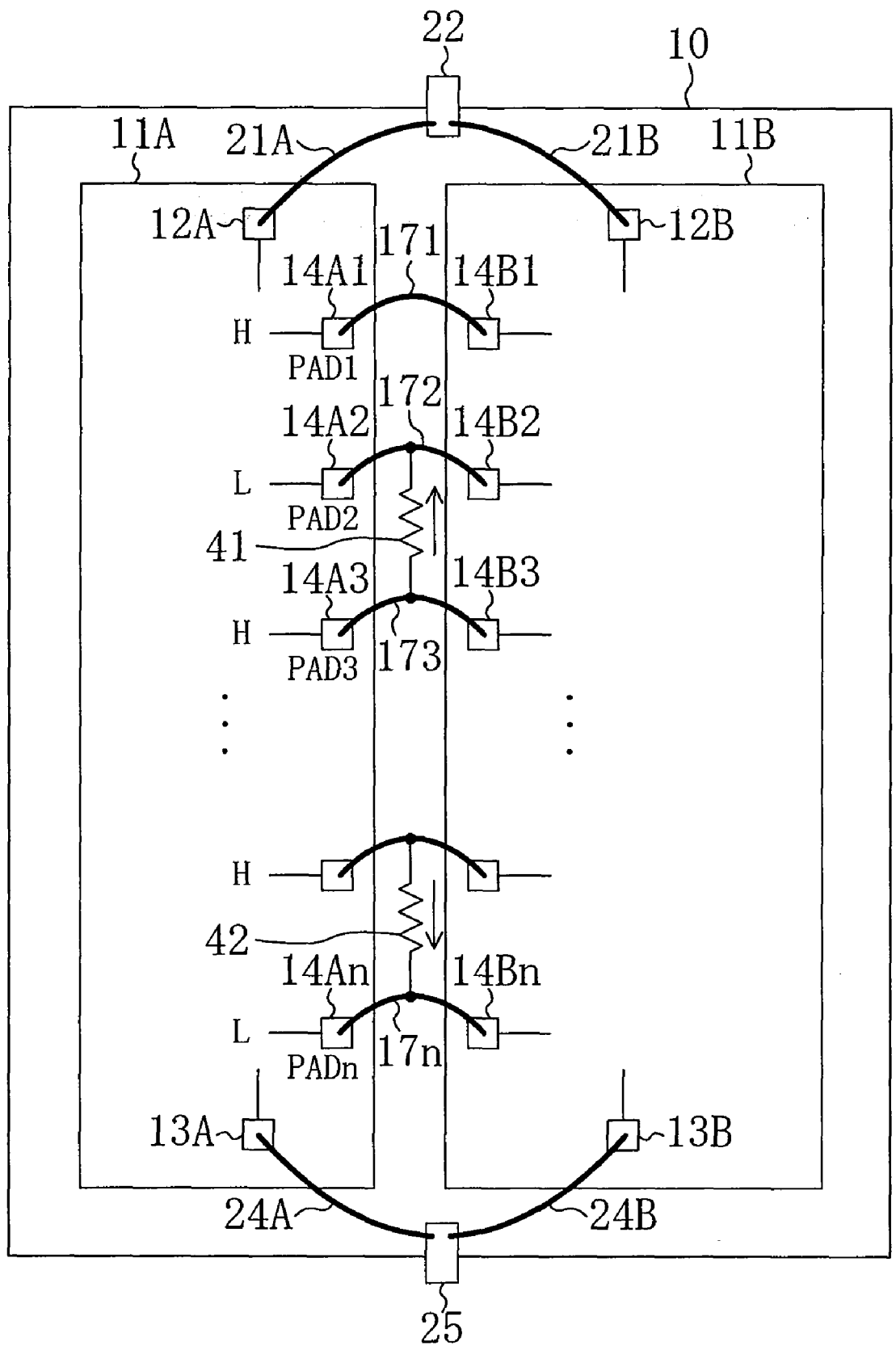
FIG. 4 is a circuit diagram showing another exemplary configuration of the semiconductor integrated circuit of the present invention.

FIG. 4 shows another exemplary configuration of the semiconductor integrated circuit 10 of the present invention. In FIG. 4, a first chip 11A has n internal connection output pad 14A1 to 14An and a second chip 11B has n internal connection input pads 14B1 to 14Bn, where n is an integer of two or more, and the first chip 11A and the second chip 11B are electrically connected via n bonding wires 171 to 17n. A first external terminal 22 is a common power supply terminal shared by the first chip 11A and the second chip 11B, and a second external terminal 25 is a common ground terminal shared by the first chip 11A and the second chip 11B. In FIGS. 4, 41 and 42 represent leakage resistance occurring between bonding wires. Note that, for the sake of simplicity, CMOS output circuits connected to the internal connection output pads 14A1 to 14An and CMOS input circuits connected to the internal connection input pads 14B1 to 14Bn are not shown in FIG. 4. Also, a test circuit for controlling states of the internal connection output pads 14A1 to 14An via the CMOS output circuits is not shown.

According to FIG. 4, the test circuit controls n pad outputs PAD1 to PADn so that the H-level output state and the L-level output state are alternated between adjacent pads. Thereby, the presence of the leakage resistance 41 and 42 between bonding wires can be found. Note that it is not possible to identify the bonding wire in which leakage occurs.

Figure 5:
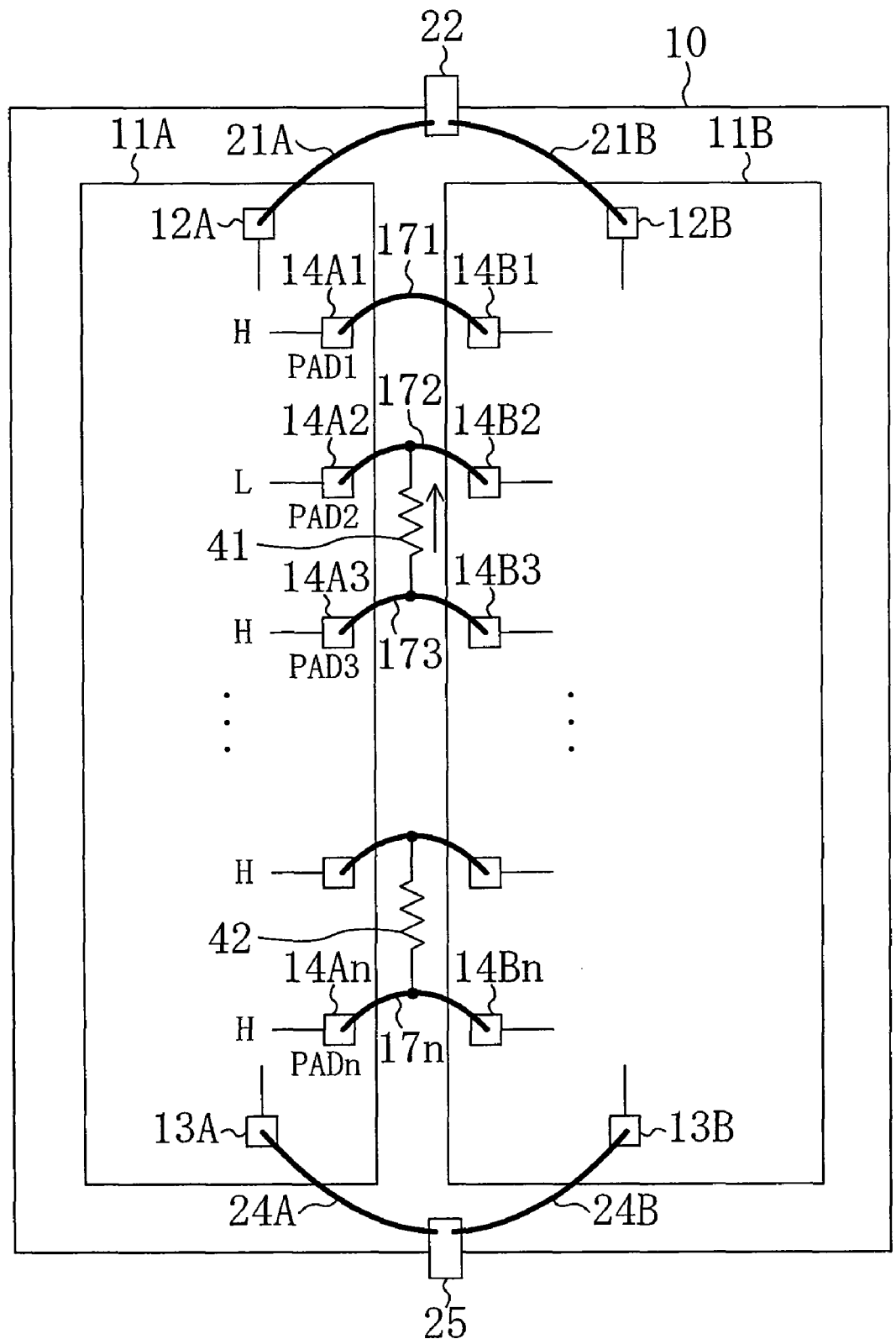
FIG. 5 is a circuit diagram showing a variation of a plurality of pad outputs of FIG. 4.

FIG. 5 shows a variation of the n pad outputs PAD1 to PADn of FIG. 4. In FIG. 5, a test circuit controls the n pad outputs PAD1 to PADn so that only a particular pad output (e.g., PAD2) has an output state (e.g., the L-level output state) having a phase opposite to that of the other pad outputs. Thereby, the location of the leakage resistance 41 between bonding wires can also be found.

Next, a test circuit will be described that has a function of successively switching the n pad outputs PAD1 to PADn to the L-level output state so as to facilitate the detection of leakage resistance between bonding wires.

Figure 6:
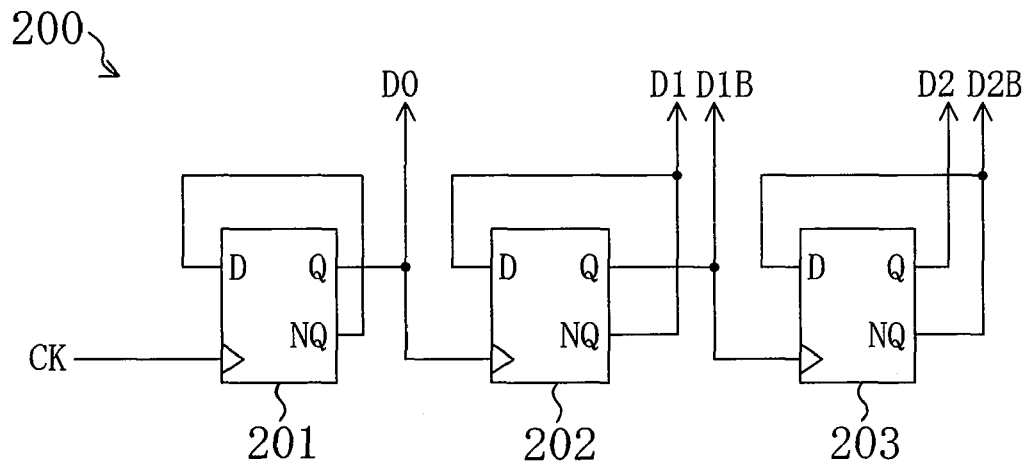
FIG. 6 is a circuit diagram showing a configuration of a frequency-division circuit in the test circuit for implementing the semiconductor integrated circuit of FIG. 5.
Figure 7:
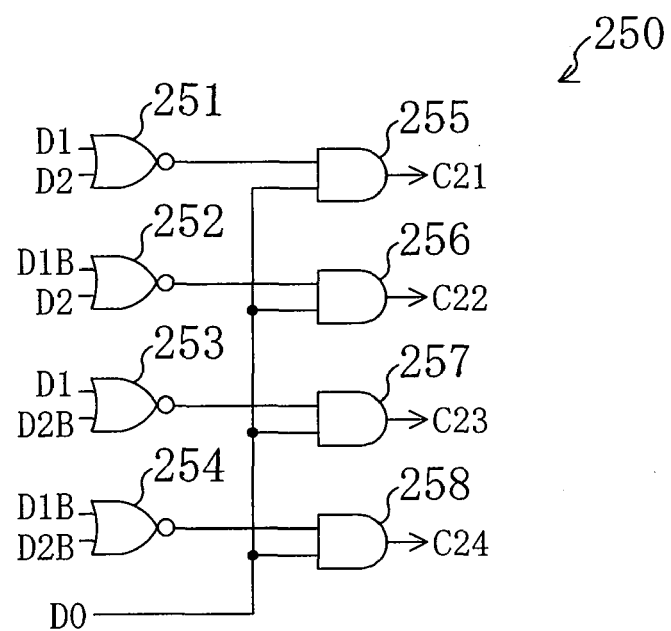
FIG. 7 is a circuit diagram showing a configuration of an output level control signal generating circuit in the test circuit for implementing the semiconductor integrated circuit of FIG. 5.
Figure 8:
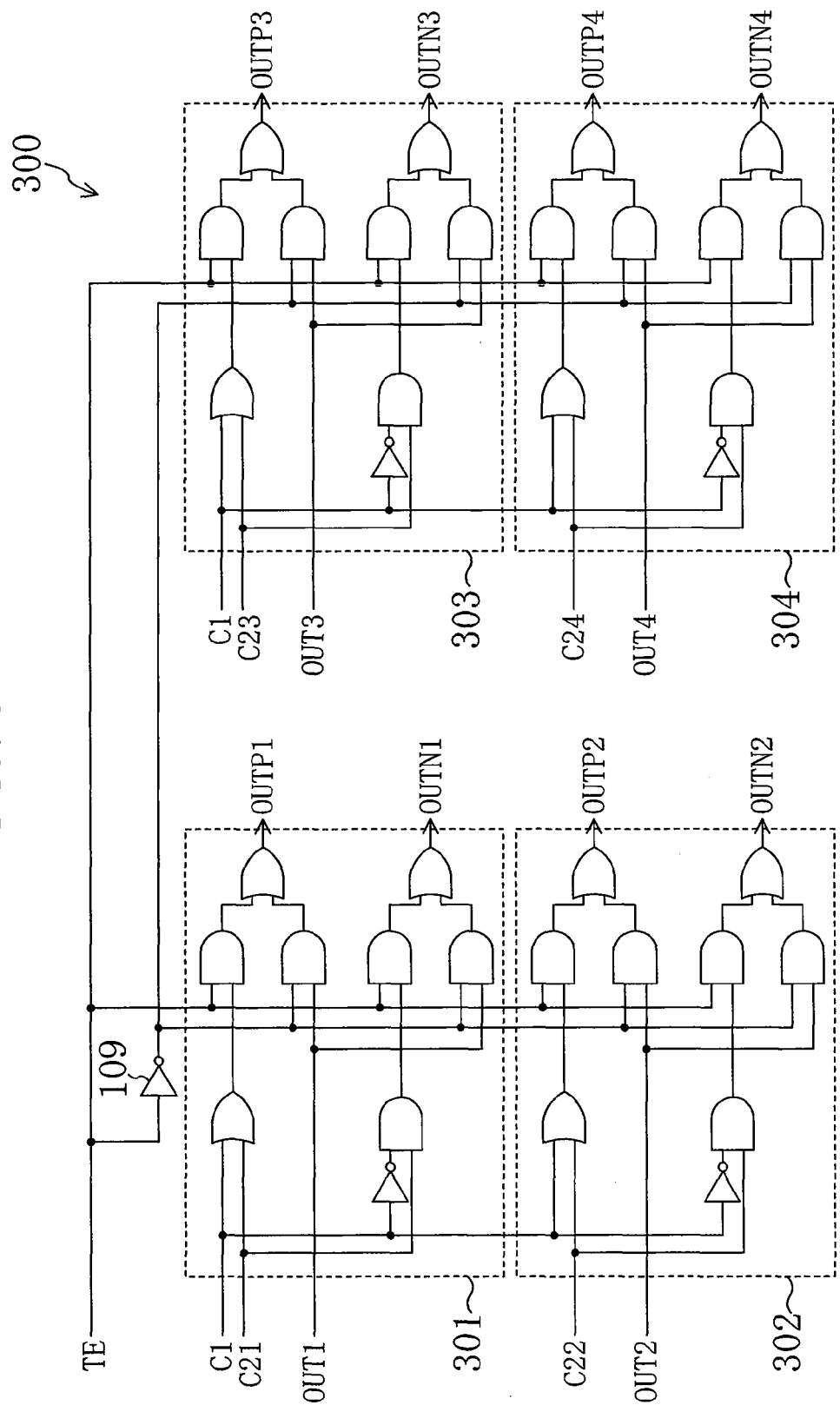
FIG. 8 is a circuit diagram showing a configuration of a pad output control signal generating circuit in the test circuit for implementing the semiconductor integrated circuit of FIG. 5.

FIGS. 6, 7 and 8 show exemplary configurations of a test circuit having such a function, where n=4. FIG. 6 is a circuit diagram showing a configuration of a frequency-division circuit 200. FIG. 7 is a circuit diagram showing a configuration of an output level control signal generating circuit 250. FIG. 8 is a circuit diagram showing a configuration of a pad output control signal generating circuit 300.

The frequency-division circuit 200 of FIG. 6 includes three D flip-flops 201, 202 and 203 so as to divide the frequency of a clock signal CK and supply five signals D0, D1, D1B, D2 and D2B to the output level control signal generating circuit 250.

The output level control signal generating circuit 250 of FIG. 7 includes four NOR gates 251, 252, 253 and 254 and four AND gates 255, 256, 257 and 258 so as to generate output level control signals C21, C22, C23 and C24 for respective pads corresponding to C2.

The pad output control signal generating circuit 300 of FIG. 8 includes unit circuits 301, 302, 303 and 304 for respective pads, each of which has a configuration similar to that of the test circuit 30 of FIG. 2, and a single inverter 109, so as to generate pad output control signals OUTP1, OUTN1, OUTP2, OUTN2, OUTP3, OUTN3, OUTP4 and OUTN4. The unit circuits 301, 302, 303 and 304 receive internal output signals OUT1, OUT2, OUT3 and OUT4 from an internal circuit (not shown), respectively, and a common output impedance control signal C1. Note that the pull-down resistor of a signal line TE is not shown in FIG. 8.

FIG. 9 shows an operation of the test circuit having the configurations of FIGS. 6 to 8. It can be seen from FIG. 9 that the four pad outputs PAD1 to PAD4 are successively switched to the L-level output state.

FIG. 10 shows still another exemplary configuration of the semiconductor integrated circuit 10 of the present invention. In FIG. 10, a first chip 11A has a tri-state buffer 51A, an input buffer 52A, and an internal connection pad 14A, and a second chip 11B has a tri-state buffer 51B, an input buffer 52B, and an internal connection pad 14B. In the first chip 11A, the output of the tri-state buffer 51A and the input of the input buffer 52A are connected to the internal connection pad 14A. Similarly, in the second chip 11B, the output of the tri-state buffer 51B and the input of the input buffer 52B are connected to the internal connection pad 14B. The internal connection pad 14A on the first chip 11A is electrically connected via a chip-to-chip bonding wire 17 to the internal connection pad 14B on the second chip 11B. The four buffers 51A, 52A, 51B and 52B all have CMOS configurations. OUTCA and OUTCB are buffer output control signals for controlling the outputs of the tri-state buffers 51A and 51B to be in the Hi-Z output state, respectively.

According to FIG. 10, a signal can be transferred from the tri-state buffer 51A on the first chip 11A to the input buffer 52B on the second chip 11B, and a signal can be transferred from the tri-state buffer 51B on the second chip 11B to the input buffer 52A on the first chip 11A. In other words, bidirectional communication can be performed between both the chips 11A and 11B. When the internal connection pad 14A on the first chip 11A functions as an output pad, the internal connection pad 14B on the second chip 11B functions as an input pad. When the internal connection pad 14B on the second chip 11B functions as an output pad, the internal connection pad 14A on the first chip 11A functions as an input pad.

In order to inspect chip-to-chip wire bonding, the first chip 11A of FIG. 10 includes a test circuit (not shown) that controls the Hi-Z output state, H-level output state and L-level output state of the internal connection pad 14A. In addition, during an operation of the test circuit, the output of the tri-state buffer 51B on the second chip 11B is controlled to be in the Hi-Z output state. Therefore, as in the case of FIG. 1, only a minute leakage current caused by chip-to-chip wire bonding can be correctly detected based on the result of current measurement in each output state (Hi-Z, H-level, L-level) of the internal connection pad 14A.

Note that the present invention is applicable to a semiconductor integrated circuit including three or more chips.

INDUSTRIAL APPLICABILITY

As described above, in the semiconductor integrated circuit of the present invention, a leakage current caused by chip-to-chip wire bonding can be easily and correctly detected without leading to an increase in the number of test circuits, and therefore, is useful as an LSI or the like having a configuration in which a plurality of chips are enclosed in the same package.

The invention claimed is:

1. A semiconductor integrated circuit comprising a first chip and a second chip, wherein
the second chip has:
an internal connection input pad; and
a CMOS input circuit connected to the internal connection input pad, and the first chip has:
an internal connection output pad electrically connected via a bonding wire to the internal connection input pad;
a CMOS output circuit connected to the internal connection output pad, and
a test circuit for controlling, via the CMOS output circuit, an output state of the internal connection output pad such that the output state of the internal connection output pad is controlled to be in each of a high-impedance output state, a high-level output state and a low-level output state, so that a current flowing through a path from a power supply to a ground of the first chip or of the second chip is measured by a ammeter.

2. The semiconductor integrated circuit of claim 1, wherein the internal connection input pad is also used as an output pad for a signal from the second chip to the first chip, and the internal connection output pad is also used as an input pad for a signal from the second chip to the first chip.

3. A semiconductor integrated circuit comprising a first chip and a second chip, wherein
the second chip has:
a plurality of internal connection input pads; and
a plurality of CMOS input circuits connected to the plurality of internal connection input pads, and the first chip has:
a plurality of internal connection output pads electrically connected via bonding wires to the plurality of internal connection input pads, respectively;
a plurality of CMOS output circuits connected to the plurality of internal connection output pads, respectively; and
a test circuit for controlling, via the plurality of CMOS output circuits, output states of the internal connection output pads such that the output states of the plurality of internal connection output pads are each controlled to be in each of a high-impedance output state, a high-level output state and a low-level output state, so that a current flowing through a path from a power supply to a ground of the first chip or of the second chip is measured by an ammeter.

4. The semiconductor integrated circuit of claim 3, wherein the test circuit has a function of controlling the plurality of internal connection output pads so that the high-level output state and the low-level output state are alternated between adjacent pads.

5. The semiconductor integrated circuit of claim 3, wherein the test circuit has a function of controlling the plurality of internal connection output pads so that only a particular pad has an output state having a phase opposite to that of the other pads.

6. The semiconductor integrated circuit of claim 5, wherein the test circuit has a function of successively switching the plurality of internal connection output pads to the opposite-phase output state.

* * * * *